United States Patent
Kimura et al.

(10) Patent No.: US 6,935,554 B2
(45) Date of Patent: Aug. 30, 2005

(54) METAL/CERAMIC BONDING ARTICLE AND METHOD FOR PRODUCING SAME

(75) Inventors: Masami Kimura, Chiba (JP); Susumu Shimada, Nagano (JP)

(73) Assignee: Dowa Mining, Co. Ltd., Tokyo (JP)

( * ) Notice: Subject to any disclaimer, the term of this patent is extended or adjusted under 35 U.S.C. 154(b) by 181 days.

(21) Appl. No.: 10/254,558

(22) Filed: Sep. 25, 2002

(65) Prior Publication Data

US 2003/0062399 A1 Apr. 3, 2003

(30) Foreign Application Priority Data

Oct. 1, 2001 (JP) .................................. P2001-304768

(51) Int. Cl.$^7$ ............................ B23K 31/00; H01C 7/00
(52) U.S. Cl. .................. 228/193; 338/204; 338/205; 338/254; 338/328; 428/615; 428/620
(58) Field of Search ................................ 428/469, 620, 428/621, 632, 668, 680, 671, 615; 338/1–334

(56) References Cited

U.S. PATENT DOCUMENTS

| | | | | |
|---|---|---|---|---|
| 3,766,634 A | * | 10/1973 | Babcock et al. | |
| 3,919,682 A | * | 11/1975 | Costa | 338/262 |
| 3,993,411 A | * | 11/1976 | Babcock et al. | |
| 3,994,430 A | * | 11/1976 | Cusano et al. | |
| 4,447,501 A | * | 5/1984 | Shigeru et al. | 428/570 |
| 4,613,549 A | * | 9/1986 | Tanaka | 428/469 |
| 4,729,504 A | * | 3/1988 | Edamura | |
| 4,887,186 A | * | 12/1989 | Takeda et al. | 361/321.4 |
| 5,164,246 A | * | 11/1992 | Tanaka et al. | 428/209 |
| 5,176,309 A | * | 1/1993 | Horiguchi et al. | 228/127 |
| 5,280,850 A | * | 1/1994 | Horiguchi et al. | 228/122.1 |
| 5,586,714 A | * | 12/1996 | Curicuta et al. | |
| 6,284,985 B1 | * | 9/2001 | Naba et al. | 174/260 |
| 6,466,124 B1 | * | 10/2002 | Shibuya et al. | 338/308 |
| 6,569,514 B2 | * | 5/2003 | Naba et al. | 428/210 |
| 6,613,450 B2 | * | 9/2003 | Tsukaguchi et al. | 428/621 |
| 6,780,520 B2 | * | 8/2004 | Tsukaguchi et al. | 428/469 |
| 2002/0060091 A1 | * | 5/2002 | Naba et al. | 174/257 |
| 2003/0062399 A1 | * | 4/2003 | Kimura et al. | 228/122.1 |
| 2003/0066865 A1 | * | 4/2003 | Tsukaguchi et al. | 228/122.1 |
| 2003/0068532 A1 | * | 4/2003 | Tsukaguchi et al. | 428/698 |
| 2003/0232204 A1 | * | 12/2003 | Tsukaguchi et al. | 428/469 |
| 2003/0232205 A1 | * | 12/2003 | Tsukaguchi et al. | 428/469 |
| 2004/0027234 A1 | * | 2/2004 | Hashimoto et al. | 338/309 |
| 2004/0043225 A1 | * | 3/2004 | Bauer et al. | 428/426 |
| 2004/0060968 A1 | * | 4/2004 | Takahashi et al. | 228/122.1 |

FOREIGN PATENT DOCUMENTS

| | | | |
|---|---|---|---|
| EP | 1298109 A2 | * | 4/2003 |
| JP | 406144942 A | * | 5/1994 |
| JP | 02003112981 A | * | 4/2003 |
| JP | 02004115310 A | * | 4/2004 |

OTHER PUBLICATIONS

Japanese Patent Laid–Open No. 10–251075 (published on Sep. 22, 1998). Attached is a copy of the abstract.

Japanese Patent Laid–Open No. 10–326949 (published on Dec. 8, 1998). Attached is a copy of the abstract.

* cited by examiner

*Primary Examiner*—Kiley S. Stoner
(74) *Attorney, Agent, or Firm*—Bachman & LaPointe, P.C.

(57) ABSTRACT

There is provided a method for producing a metal/ceramic bonding article, the method including the steps of: arranging a metal plate 12 of an overall-rate solid solution type alloy on a ceramic substrate 10; and heating the metal plate 12 and the ceramic substrate 10 in a non-oxidizing atmosphere at a temperature of lower than a melting point of the alloy to bond the metal plate 12 directly to the ceramic substrate 10. According to this method, it is possible to easily bond an alloy plate directly to a ceramic substrate, and it is possible to inexpensively provide an electronic member for resistance without causing the alloy plate to be deteriorated.

9 Claims, 1 Drawing Sheet

METAL/CERAMIC BONDING ARTICLE AND METHOD FOR PRODUCING SAME

BACKGROUND OF THE INVENTION

1. Field of the Invention

The present invention generally relates to a metal/ceramic bonding article having a ceramic substrate and a metal plate of an overall-rate solid solution type alloy bonded directly to the ceramic substrate, and a method for producing the same. More specifically, the invention relates to an electronic member for resistance wherein a metal plate of a copper containing alloy, such as a copper-nickel or copper-nickel-manganese alloy, is bonded directly to a ceramic substrate as a resistor, and a method for producing the same.

2. Description of the Prior Art

As an example of a method for bonding a metal plate directly to a ceramic substrate, there is known a method for bonding a copper plate directly to an oxide ceramic substrate (e.g., an alumina substrate) by utilizing an eutectic melt of copper with oxygen. Metal/ceramic bonding articles produced by such a method are utilized as electronic circuit boards or the like (see U.S. Pat. No. 3,994,430). In this technique, an element forming an eutectic with a certain metal is added to the metal or incorporated into the metal from a bonding atmosphere, to utilize an eutectic melt of the metal with the element as a bonding binder at a temperature of a melting point of the metal or lower and at a temperature of an eutectic point or higher. However, in this method, there is a problem in that the metal or alloy capable of being bonded directly to the ceramic as a solid is limited to a metal capable of forming an eutectic melt.

There are known methods for bonding a metal plate to a ceramic substrate via a brazing filler metal as an intermediate material. For example, there is known a method for bonding a copper plate to a ceramic substrate by adding an active metal, such as titanium or zirconium, to a silver-copper brazing filler, and copper/ceramic bonding articles produced by such a method are also utilized as electronic circuit boards or other structural articles (see Japanese Patent Laid-Open No. 10-251075). In these bonding articles, the element, such as titanium or zirconium, which is an active metal in the brazing filler metal, reacts with the components of the ceramic to produce reaction products on the interface between copper plate and the ceramic substrate to bond the copper plate to the ceramic substrate. Therefore, the copper plate is not bonded to the ceramic substrate unless the active metal is used. In this method, there are problems in that it is required to use a noble metal, such as silver, in the brazing filler metal and to produce the bonding article in a high vacuum state, so that the producing costs are relatively high. There is also a problem in that this method can not be applied to bonding for an electronic member for resistance since the value of resistance of the electronic member varies by alloying with the brazing filler metal.

Moreover, there is known a so-called molten metal bonding method comprising the steps of melting a metal in a non-oxidizing atmosphere to cause the metal to directly contact a ceramic substrate, and moving the metal to remove an oxide film and so forth on the surface thereof to bond the metal directly to the ceramic substrate (Japanese Patent Laid-Open No. 7-276035). In theory, the molten metal on the fresh surface of the metal is moved in a non-oxidizing atmosphere to cause the active surface of the metal to contact the ceramic substrate to bond the metal directly to the ceramic substrate. In this technique, all the metal to be bonded is first melted, so that it is required to previously prepare a mold or die having a predetermined shape which is a target shape after bonding. Metal/ceramic bonding articles produced by this method are also utilized as electronic circuit boards or the like. However, in this method, since the metal is melted to be cast, there are problems in that it is difficult to prepare electronic materials, such as vary thin resistors, and the producing costs increase.

On the other hand, a copper-nickel alloy is known as the material of a resistor, and constantan and manganin are used as the materials of fine resistors for electrometers, compensating lead wires, piezoresistance stress meters and so forth. These alloys are used as wire materials or applied on organic films as gages.

However, if a resistor is prepared by any one of the above described conventional methods, there is a problem in that it is difficult to precisely measure the value of resistance of the resistor due to the generation of heat.

SUMMARY OF THE INVENTION

It is therefore an object of the present invention to eliminate the aforementioned problems and to provide a metal/ceramic bonding article which has a good formability and which can be produced by bonding a solid alloy to a ceramic substrate without melting the alloy and without the need of any brazing filler metal, and a method for producing the same at low costs.

It is another object of the present invention to provide an electronic member for resistance, which has stable characteristics and which is produced by bonding a copper alloy plate serving as a resistor directly to a ceramic serving as a radiating member.

In order to accomplish the aforementioned and other objects, the inventors have diligently studied and found that it is possible to obtain the above described bonding article by controlling temperature and atmosphere at the time of bonding, and by processing the surface of an alloy if necessary.

According to one aspect of the present invention, there is provided a method for producing a metal/ceramic bonding article, the method comprising the steps of: arranging a metal member of an overall-rate solid solution type alloy on a ceramic member; heating the metal member and the ceramic member in a non-oxidizing atmosphere at a temperature of lower than a melting point of the alloy to bond the metal member directly to the ceramic member.

This method for producing a metal/ceramic bonding article may further comprise a step of oxidizing a surface of the metal member before the arranging step.

In the above described method for producing a metal/ceramic bonding article, the oxidizing step may be carried out by heating the metal member in the atmosphere. The overall-rate solid solution type alloy is preferably a copper containing alloy. The copper containing alloy is preferably an alloy containing copper and nickel, such as constantan, or an alloy containing copper, nickel and manganese, such as manganin. The ceramic member is preferably an oxide ceramic substrate.

According to another aspect of the present invention, there is provided a metal/ceramic bonding article comprising: a ceramic member; and a metal member bonded directly to the ceramic member, the metal member being made of an overall-rate solid solution type alloy.

In this metal/ceramic bonding article, the overall-rate solid solution type alloy is preferably a copper containing alloy. The copper containing alloy is preferably an alloy containing copper and nickel, such as constantan, or an alloy containing copper, nickel and manganese, such as manganin. The metal member preferably has a peel strength of 5 kg/cm or more.

According to a further aspect of the present invention, there is provided an electronic member for resistance, which comprises: a ceramic substrate; and a resistor directly to the ceramic substrate, the resistor being made of a copper containing alloy.

In this electronic member for resistance, the resistor is preferably made of an alloy containing copper and nickel, or an alloy containing copper, nickel and manganese.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a metal/ceramic bonding article and a method for producing the same according to the present invention will be described below.

Figure 1:
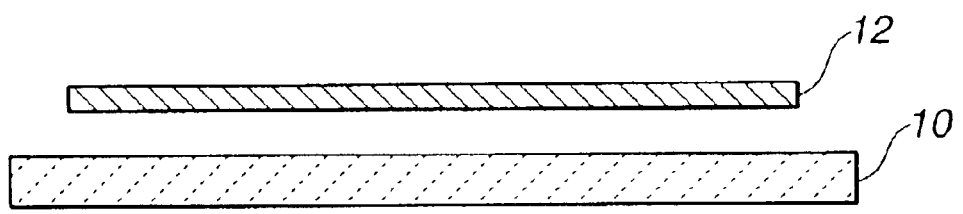
FIG. 1 is a sectional view showing a producing step in a preferred embodiment of a method for producing a metal/ceramic bonding article according to the present invention.

First, as shown in FIG. 1, a metal plate 12 of an alloy exhibiting an overall-rate solid solution in a phase diagram, such as a copper containing alloy, e.g., a copper-nickel alloy (e.g., constantan) or a copper-nickel-manganese (e.g., manganin), is arranged on a ceramic substrate 10, such as an alumina substrate.

Figure 2:
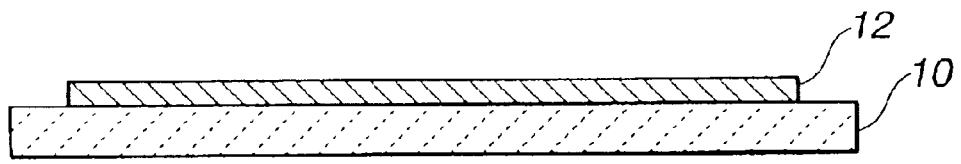
FIG. 2 is a sectional view showing a producing step in a preferred embodiment of a method for producing a metal/ceramic bonding article according to the present invention.

Then, as shown in FIG. 2, the metal plate 12 is directly brought into contact with the ceramic substrate 10 to be bonded to the ceramic substrate 10 in a non-oxidizing atmosphere at a temperature of lower than the melting point of the alloy, to obtain a metal/ceramic bonding article.

The surface of the alloy plate is preferably oxidized before bonding, since an allowable temperature range serving as one of bonding conditions increases. This oxidation can be simply carried out by heating the alloy in the atmosphere or the like. The reason why the alloy plate is heated in the non-oxidizing atmosphere it that it is possible to prevent electric characteristics and so forth from being deteriorated by oxidation on the surface of the alloy plate after bonding. Although such a bonding mechanism is not clearly understood, there is some possibility that oxygen of the alloy may participate in bonding since the alloy plate is easily bonded to the ceramic substrate by oxidizing the surface of the alloy.

The copper alloy plate for resistance can be bonded directly to the ceramic substrate to form an electronic member for resistance. The copper alloy plate is preferably bonded to a ceramic substrate having good radiating characteristics since the ceramic substrate is used as a radiating member.

In a metal/ceramic bonding article according to the present invention, any materials greatly inhibiting heat conduction do not exist on the bonding interface. Therefore, it is possible to obtain sufficient radiating characteristics, and it is possible to produce the bonding article by a simple process, so that the costs can be decreased.

Examples of metal/ceramic bonding articles and methods for producing the same according to the present invention will be described below in detail.

EXAMPLE 1

A manganin plate of a copper-nickel-manganese alloy having a thickness of 0.1 mm was arranged directly on an alumina substrate of 96% alumina serving as a ceramic for an electronic material and having a thickness of 0.635 mm, to be heated in an atmosphere of nitrogen (concentration of oxygen: 10 ppm or less) at a maximum temperature of 1,000° C. for 10 minutes, and then, slowly cooled. Then, it was observed that the manganin plate was bonded to the alumina substrate by the above described process. It was not observed that the manganin plate was deteriorated.

EXAMPLE 2

The same manganin plate as that in Example 1 was bonded to the same alumina substrate as that in Example 1 by the same method as that in Example 1, except that the manganin plate was previously heated in the atmosphere to be oxidized. Then, it was observed that the manganin plate was bonded to the alumina substrate by the above described process. It was also measured that the peel bonding strength of the manganin plate was 5 kg/cm or more, so that it was found that the manganin plate was strongly bonded to the alumina substrate. It was not observed that the manganin plate was deteriorated.

EXAMPLE 3

The same manganin plate as that in Example 1 was bonded to the same alumina substrate as that in Example 1 by the same method as that in Example 2, except that the maximum temperature was 990° C. Then, it was observed that the manganin plate was bonded to the alumina substrate by the above described process. It was also measured that the peel bonding strength of the manganin plate was 5 kg/cm or more, so that it was found that the manganin plate was strongly bonded to the alumina substrate. It was not observed that the manganin plate was deteriorated.

EXAMPLE 4

The same manganin plate as that in Example 1 was bonded to the same alumina substrate as that in Example 1 by the same method as that in Example 2, except that the maximum temperature was 985° C. Then, it was observed that the manganin plate was bonded to the alumina substrate by the above described process. It was also measured that the peel bonding strength of the manganin plate was 5 kg/cm or more, so that it was found that the manganin plate was strongly bonded to the alumina substrate. It was not observed that the manganin plate was deteriorated.

Comparative Example

The same manganin plate as that in Example 1 was arranged on the same alumina substrate as that in Example 1 via a silver brazing filler containing titanium as an active metal to be heated at a maximum temperature of 850° C. Thus, the manganin plate was bonded to the alumina substrate by the brazing and soldering method, not the direct bonding method. As a result, although both were strongly bonded to each other, it was observed that the manganin plate was deteriorated by the diffusion of the brazing filler metal into the manganin plate.

As described above, according to the present invention, it is possible to easily bond an alloy plate directly to a ceramic substrate, and it is possible to inexpensively provide an electronic member for resistance without causing the alloy plate to be deteriorated.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A metal/ceramic bonding article comprising:
   a ceramic substrate; and
   a solid metal plate bonded directly to said ceramic substrate, said solid metal plate being made of an overall-rate solid solution type alloy.

2. A metal/ceramic bonding article as set forth in claim 1, wherein said overall-rate solid solution type alloy is a copper containing alloy.

3. A metal/ceramic bonding article as set forth in claim 2, wherein said copper containing alloy is an alloy containing copper and nickel.

4. A metal/ceramic bonding article comprising:
   a ceramic member; and
   a metal member bonded directly to said ceramic member, said metal member being made of an alloy containing copper, nickel and manganese.

5. A metal/ceramic bonding article comprising:
   a ceramic member; and
   a metal member bonded directly to said ceramic member, said metal member being made of an overall-rate solid solution type alloy,
   wherein said metal member has a peel strength of 5 kg/cm or more.

6. An electronic member for resistance, which comprises:
   a ceramic substrate; and
   a resistor bonded directly to said ceramic substrate, said resistor being made of a copper containing alloy.

7. An electronic member for resistance as set forth in claim 6, wherein said resistor is made of an alloy containing copper and nickel, or an alloy containing copper, nickel and manganese.

8. A metal/ceramic bonding article as set forth in claim 1, wherein said solid metal plate is bonded directly to said ceramic substrate without using any brazing filler metal.

9. A metal/ceramic bonding article as set forth in claim 8, wherein said solid metal plate is bonded directly to said ceramic substrate without using any eutectic melt.

* * * * *